(12) United States Patent
Mueller et al.

(10) Patent No.: US 6,703,956 B1
(45) Date of Patent: Mar. 9, 2004

(54) TECHNIQUE FOR IMPROVED LINEARITY OF HIGH-PRECISION, LOW-CURRENT DIGITAL-TO-ANALOG CONVERTERS

(75) Inventors: Brian Mueller, Fort Collins, CO (US); Barbara J. Duffner, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/338,235

(22) Filed: Jan. 8, 2003

(51) Int. Cl.[7] .............................. H03M 1/66; H03M 1/68
(52) U.S. Cl. ...................................... 341/145; 341/136
(58) Field of Search ................................. 341/133, 136, 341/144, 145

(56) References Cited

U.S. PATENT DOCUMENTS

| | | | | |
|---|---|---|---|---|
| 5,446,455 A | * | 8/1995 | Brooks ........................ | 341/145 |
| 5,703,587 A | * | 12/1997 | Clark et al. .................. | 341/144 |
| 5,844,511 A | * | 12/1998 | Izumikawa ................. | 341/136 |
| 6,037,889 A | | 3/2000 | Knee | |
| 6,166,670 A | * | 12/2000 | O'Shaughnessy ............ | 341/136 |
| 6,204,790 B1 | * | 3/2001 | Jin et al. ..................... | 341/145 |
| 6,225,929 B1 | | 5/2001 | Beck | |
| 6,424,283 B2 | * | 7/2002 | Bugeja et al. .............. | 341/145 |

OTHER PUBLICATIONS

Teddy Loeliger and Walter Guggenbuhl, "Cascode circuits for switched current copiers", Midwest Symposium on Circuits and Systems, Aug. 1997, pp. 256–259.

K.Ola Andersson and J.Jacob Wikner, "Characterization of a CMOS current–steering DAC using state–space models," in Proc. 2000 IEEE Midwest Symp. Circuits Syst. MWS-CAS'2000, Michigan, Aug. 5, 2000.

* cited by examiner

Primary Examiner—Howard L. Williams

(57) ABSTRACT

A high-precision high-linearity digital-to-analog converter (DAC) and a method for converting a digital input signal having N bits to a substantially equivalent analog current output signal is presented. The DAC segments the digital input signal bits into groups separate processing. The invention includes a first current-steering digital-to-analog converter configured to receive a first group of i input signal bits and a first reference current to produce a first current signal. A second current-steering digital-to-analog converter is configured to receive a second group of j input signal bits and the first reference current to produce an intermediate current signal. The intermediate current signal is scaled down by a factor of $2^j$ to produce a second current signal. A summing circuit sums at least the first and second current signals to produce an analog current signal representative of the digital input signal value.

14 Claims, 4 Drawing Sheets

US 6,703,956 B1

TECHNIQUE FOR IMPROVED LINEARITY OF HIGH-PRECISION, LOW-CURRENT DIGITAL-TO-ANALOG CONVERTERS

FIELD OF THE INVENTION

The present invention relates generally to digital-to-analog conversion of electrical signals, and more particularly to a high-precision, low-current current-steering digital-to-analog converter.

BACKGROUND OF THE INVENTION

A digital-to-analog converter (DAC) converts a digital input signal represented by a number of bits N to a substantially equivalent analog output signal. The analog output signal is typically a voltage or current signal.

A typical DAC for converting the digital input signal into an analog current output signal is a current-steering DAC. In one type of current-steering DAC, a reference voltage is converted into binary-weighted currents. For example, in one such current-steering DAC, switches couple each input of parallel coupled binary weighted resistors to either a reference voltage or ground depending on whether the digital input signal bit is a logic 1 level or a logic 0 level. The outputs of each of the binary weighted resistors are coupled to an output current node.

Another example of a current-steering DAC employs an R-2R ladder coupled to a reference voltage. Switches are coupled in parallel to outputs of the R-2R resistor ladder. The switches are controlled by digital input signal bits to couple the current from the outputs of the R-2R resistor ladder to ground when the digital input signal bit is at a logic 0 level or to a current output node when the digital input signal bit is at a logic 1 level.

SUMMARY OF THE INVENTION

The present invention provides a digital-to-analog converter (DAC) and a method for converting a digital input signal having N bits to a substantially equivalent analog current output signal. The DAC of the invention utilizes bit segmentation and shared reference current(s) to allow high precision, high linearity, and a high input signal bit count resulting from the ability to ensure CMOS FET saturation even in the submicron and deep submicron process technologies.

In accordance with the invention, the N-bit binary digital input signal is segmented into at least a first group of i bits and a second group of j bits. The DAC of the invention includes a first current-steering digital-to-analog converter configured to receive the first group of i bits and a first reference current that produces a first digital-to-analog converter output current representation based on the value of the first group of i digital bits. The DAC also includes at least a second current-steering digital-to-analog converter configured to receive the second group of j bits of the N-bit binary digital input signal and the first reference current. The second current-steering digital-to-analog converter produces a second digital-to-analog converter output current representative of a value of the second group of j bits. The second digital-to-analog converter output current is scaled down by an order of magnitude substantially equal to $2^j$ by a current scaling circuit. The DAC includes a summing circuit which sums at least the first digital-to-analog converter output current and the scaled down version of the second digital-to-analog converter output current to produce an analog current signal representative of the value of the N-bit binary input signal.

In a preferred embodiment, the DAC includes a binary-to-thermometer encoder dedicated to each segmented group i, j of digital input signal bits. A first binary-to-thermometer encoder converts the first group of i bits to a thermometer code represented by $2^i$ thermometer code bits, and a second binary-to-thermometer encoder converts the second group of j bits to a thermometer code represented by $2^j$ thermometer code bits. Additional binary-to-thermometer encoders may be used if the digital input signal of N bits is further segmented into additional segmented groups of bits $k_x$.

The DAC also includes a group of identical current source arrays dedicated to each segmented group i, j of digital input signal bits. More particularly, the DAC includes at least a first array of $2^i$ identical current sources each of which is selectable by a respective one of the $2^i$ thermometer code bits to contribute an identical current referenced by a first reference current to an output line. The sum of the identical currents contributed by the first array of $2^i$ identical current sources is therefore summed on the output line. The DAC further includes at least a second array of $2^j$ identical current sources each of which is selectable by a respective one of the $2^j$ thermometer code bits to contribute an identical current referenced by a first reference current to an intermediate output line. The sum of the identical currents contributed by the second array of $2^j$ identical current sources is therefore summed on the intermediate output line.

The DAC also includes a current dividing circuit which divides the total current present on the intermediate output line by $2^j$. The divided current is added to the current on the output line. Accordingly, an analog current signal representation of the digital input signal is produced on the output line of the DAC.

In a preferred embodiment, a 16-bit DAC is implemented with a 4-6-6 bit grouping, with the 4 highest significant bits encoded to generate a $2^4$-bit thermometer code, the next 6 highest significant bits encoded to generate a $2^6$-bit thermometer code, and the lowest 6 significant bits encoded to generate a $2^6$-bit thermometer code. In this embodiment, the high thermometer code bits are fed to a high current source array comprising $2^4$ current sources. Each current source is selectable by a different one of the $2^4$ bits of the high thermometer code. When a high thermometer code bit is asserted, its respective current source generates a current substantially equal to a high reference current.

The mid thermometer code bits are fed to a mid current source array comprising $2^6$ current sources. Each current source in the mid current source array is selectable by a different one of the $2^6$ bits of the mid thermometer code. When a mid thermometer code bit is asserted, its respective current source generates a current substantially equal to a mid reference current.

The low thermometer code bits are fed to a low current source array comprising $2^6$ current sources. Each current source in the low current source array is selectable by a different one of the $2^6$ bits of the low thermometer code. When a low thermometer code bit is asserted, its respective current source generates a current substantially equal to the mid reference current. The total current contributed by each of the low current sources is summed on an intermediate output line, which is fed to a divider circuit that divides the summed outputs from the current sources in the low current source array by $2^6$ to scale down the current.

The total current contributed by each of the selected high current sources, each of the selected mid current sources, and the current output by the current divider is summed to produce an analog current signal representation of a given 16-bit digital input signal.

The segmentation and sharing of a mid-level reference current with the lowest-level segmented DAC allows the current-steering DAC of the invention to handle subthreshold current LSB's in a submicron process while maintaining very good linearity. In particular, this entails the sharing of references (Low, Mid) so the current mirror arrays are "identical" and the divide-by-64 current circuit that generates the lowest 6 bits of the 16-bit DAC.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE DRAWINGS

Figure 1:
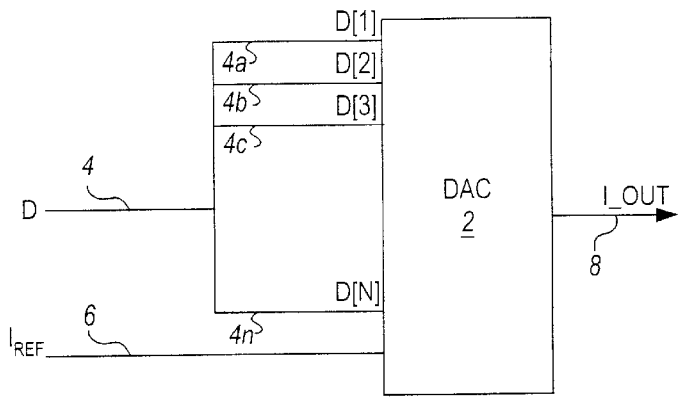
FIG. 1 is a high-level block diagram of a current-steered digital-to-analog converter.

A digital-to-analog converter (DAC) is illustrated generally at 2 in FIG. 1 in block diagram form. DAC 2 receives a digital input signal D on a line 4. The digital input signal D on line 4 includes N bits (D[1]–D[N]), each of which has a first state and second state, and each of which is presented to the DAC 2 on a respective individual bit line 4a–4n. A reference current $I_{REF}$ is provided to the DAC 2 on a line 6. DAC 2 generates an analog current output signal I_OUT on output line 8. The analog current output signal I_OUT is an analog current proportional to the digital input signal D represented by digital input signals bits D[1]–D[N]. Reference current $I_{REF}$ determines the maximum range and step size of the output current I_OUT generated by the DAC 2.

Several design techniques exist to implement a DAC with an analog current output signal. One such design technique provides the digital input signal bits D[1]–D[N] to respective individual bit select lines of N switchable current sources. The current output by each respective N switchable current source increases in a binary weighted manner from least significant digital input signal bit D[N] to most significant digital input signal bit D[1]. In this regard, each of the current sources is designed to supply twice the current of its immediate neighbor. For conversion of a digital input signal D[1]–D[N], each of the current sources may be configured to be switched on and off by one of the bits in the digital input signals. For each bit D[i] in the digital input signal D[1]–D[N] that is asserted, the corresponding current source is turned on to contribute a proportional amount of current on the output line. The currents from all active current sources are summed on the output line, resulting in an analog representation of the magnitude of the digital input signal.

In an integrated circuit, the switchable current sources are implemented using transistor technology; accordingly, assuming the bias voltage and select signal voltages are respectively identical across the current sources, the amount of current output by each switchable current source is dictated by the sizing of its transistors. In a DAC with an internal binary selection scheme, the current cell blocks that implement the switchable current sources are structurally identical; however, the transistors that implement the current cell blocks are sized in a binary weighted manner in order of increasing bit significance. Thus, the attendant advantages of the DAC implementation with internal binary selection scheme is its reduced complexity in terms of a minimum number of current cell blocks (equal to the number of digital input signal lines N) and therefore a minimized number of control lines. However, since corresponding transistors between each cell block are sized according to a binary weighted scheme and therefore are not sized identically, the internal binary selection scheme of this DAC implementation results in lower precision and diminished output signal linearly due to the increased potential for current cell mismatch.

An alternative way to implement a current-steering DAC is through the use of an internal thermometer code selection scheme. In this implementation each of the digital input signal bits D[1]–D[N] are provided to a binary-to-thermometer encoder which outputs a plurality of thermometer-encoded select bits T[1]–T[$2^N$]. An example of a binary-to-thermometer code conversion is provided in the following Table I for a three bit binary input and a seven bit thermometer code output.

TABLE I

| Binary Input | Thermometer Output |
| --- | --- |
| 000 | 0000000 |
| 001 | 0000001 |
| 010 | 0000011 |
| 011 | 0000111 |
| 100 | 0001111 |
| 101 | 0011111 |
| 110 | 0111111 |
| 111 | 1111111 |

As illustrated by Table I, in order for a given thermometer code bit to be asserted (i.e., a "1"), each lower significant thermometer code bit must also be asserted. Thus, from TABLE I, if the binary input value is "101" (or decimal "5"), the thermometer encoded select bits assert the lowest five thermometer code bits. These asserted bits are provided in turn to switch on five corresponding identical current cell blocks, each of which output a standard current cell block output value equal to the amount of current output by the DAC if only the least significant bit (LSB) is set. Accordingly, the output current in this example is a total output current of 5 times the standard current cell block output value, or LSB current value. The attendant advantages of the DAC implementation with internal thermometer code selection scheme includes higher precision and output signal linearity due to improved current cell matching through the use of current cells that are identical in both structure and transistor sizing. However, the number of current cell blocks required increases exponentially with the number of bits. For example, in a 16-bit DAC, the number of current cell blocks required to implement a DAC with pure internal thermometer code selection scheme requires $2^{16}$ or 65,536 current cell blocks. Accordingly, the complexity of the DAC is much greater with the thermometer code selection scheme.

Many DAC applications specify a maximum current limit $I_{MAX}$. In a thermometer encoded current source selection scheme, this means that the resolution of the current output by each of the current cells is $I_{MAX}/2^N$—that is, each current cell block must contribute the LSB current amount equal to $I_{MAX}/2^N$ such that if all current cell blocks are turned on, the analog output current value will be $I_{MAX}$.

A common maximum operating current limit $I_{MAX}$ in digital integrated circuit applications is 1 mA. Thus, if a 16-bit DAC is required, the amount of current contributed by each individual current cell block must be $I_{MAX}/2^N=1$ mA/$2^{16}=15*10^{-12}$ Amps or 15 pA. Current-steered switchable current sources are typically implemented with a single-reference multiple-mirror current mirror that provides a bias current to the sources of the switchable FET devices. Basic current mirrors assume the devices are saturated. Referring to the reference FET as device 1 and the mirror FET as device 2, then the drain currents of each are: $I_{REF}=0.5u_nC_{ox}(W/L)_1(V_{GS}-V_T)^2$ and $I_{OUT}=0.5u_nC_{ox}(W/L)_2(V_{GS}-V_T)^2$. Then: $I_{OUT}=(W/L)_2/(W/L)_1*I_{REF}$. Operating the devices in saturation minimizes the change in drain current with changes in $V_{DS}$ of the reference and mirror devices. In CMOS submicron process technologies that have a minimum gate length, for example a 0.25 micron process technology, a current magnitude of 15 pA does not generate a gate-to-source voltage $V_{gs}$ greater than the FET's threshold voltage $V_t$, even for relatively very large (>5 micron length) devices. Therefore, the device will operate in sub-threshold conduction. In this operating region the drain current is exponentially dependent on $V_{gs}$: $I_D=I_o*\exp(V_{GS}/nV_T)$, where n is the nonideality factor (n>1) and $V_T=kT/q$. The exponential dependence of the drain current of the FET on $V_{GS}$ and/or $V_T$ implies that a small change in $V_{GS}$ (or $V_T$) will cause an exponential change in $I_D$ (the LSB current). This dependence is therefore very bad for matching. For DAC precision and linearity, it is of utmost importance to minimize variations in $I_D$ from current mirror to current mirror. Accordingly, a DAC implemented with a pure internal thermometer encoded selection scheme is impractical and non-workable for submicron or smaller process technology DACs having over a few bits and/or for applications with low maximum current limits.

Figure 2:
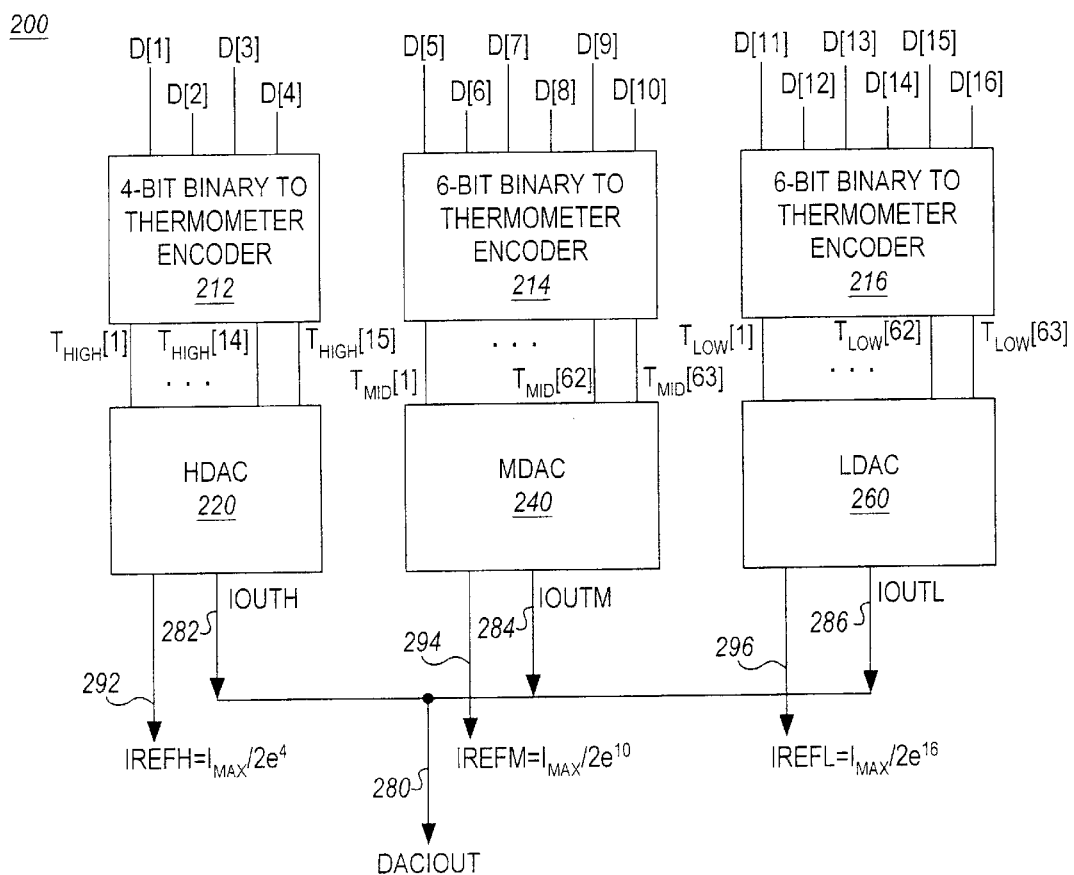
FIG. 2 is a detailed block diagram of a prior art 16-bit current-steered DAC.

In order to reap the advantages of high-precision, high-linearity afforded by internal thermometer encoded selection schemes with the advantages of lower cell count afforded by internal binary selection schemes, hybrid solutions have been developed. FIG. 2 illustrates a prior art 16-bit DAC that segments the DAC into a High DAC (HDAC) 220, a Mid DAC (MDAC) 240, and a Low DAC (LDAC) 260. The binary digital input signal bits D[1]–D[16] are segmented into a group of high input signal bits D[1]–D[4], a group of medium input signal bits D[5]–D[10], and a group of low input signal bits D[11]–D[16].

The high input signal bits D[1]–D[4] are provided to the input of a 4-bit binary-to-thermometer encoder 212, which encodes the binary value of the received high input signal bits D[1]–D[4] to a thermometer code represented by output thermometer code bits $T_{HIGH}[1]$–$T_{HIGH}[15]$. It will be appreciated by those familiar with thermometer encoding that since all bits deasserted (i.e., off or "0") represents the state of zero or "no" current, that only $2^4-1$ (or 15) bits are required to be output by the 4-bit binary-to-thermometer encoder 212 to represent the full range of thermometer coded states.

The high thermometer encoded select bits $T_{HIGH}[1]$–$T_{HIGH}[15]$ are provided to HDAC 220, which implements an internal thermometer code selection scheme to select zero or more current cell blocks to contribute current to a HDAC output signal IOUTH on line 282. The magnitude of the HDAC output signal IOUTH depends in part on the value of the high thermometer encoded select bits $T_{HIGH}[1]$–$T_{HIGH}[15]$ and in part on the value of the high reference current $I_{refH}$.

The mid input signal bits D[5]–D[10] are provided to the input of a 6-bit binary-to-thermometer encoder 214, which encodes the binary value of the received mid input signal bits D[5]–D[10] to a thermometer code represented by output thermometer code bits $T_{MID}[1]$–$T_{MID}[63]$. Again, since all bits deasserted (i.e., off or "0") represents the state of zero or "no" current, only $2^6-1$ (or 63) bits are required to be output by the 6-bit binary-to-thermometer encoder 214.

The mid thermometer encoded select bits $T_{MID}[1]$–$T_{MID}[63]$ are provided to MDAC 240, which implements an internal thermometer code selection scheme to select zero or more current cell blocks to contribute current to an MDAC output signal IOUTM on line 284.

The low input signal bits D[11]–D[16] are provided to the input of a 6-bit binary-to-thermometer encoder 216, which encodes the binary value of the received low input signal bits D[11]–D[16] to a thermometer code represented by output thermometer code bits $T_{LOW}[1]$–$T_{LOW}[63]$. Since all bits deasserted (i.e., off or "0") represents the state of no current, only $2^6-1$ (or 63) bits are required to be output by the 6-bit binary-to-thermometer encoder.

The low thermometer encoded select bits $T_{LOW}[1]$–$T_{LOW}[63]$ are provided to LDAC 260, which implements an internal thermometer code selection scheme to select zero or more current cell blocks to contribute current to an LDAC output signal IOUTL on line 286.

The HDAC output signal IOUTH on line 282, MDAC output signal IOUTM on line 284, and HDAC output signal IOUTH on line 286 are summed on DAC output line 280 to produce the analog current output signal DACIOUT.

The design of the hybrid DAC structure of FIG. 2 requires three separate external reference currents. The HDAC reference current $I_{refH}$ is weighted to be approximately $2^4*I_{refM}=16*I_{refM}$, and the MDAC reference current $I_{refM}$ is weighted to be approximately $2^6*I_{refL}=64*I_{refL}$. The low reference current $I_{refL}$ is selected to be the current necessary to represent the least significant bit (LSB) of the LDAC, which in a 16-bit DAC is on the order of $I_{MAX}/2e^{16}$. As discussed above, for a maximum current specification $I_{MAX}$ of 1 mA, this requires a low reference current $I_{refL}$ of approximately 15 pA.

Figure 3:
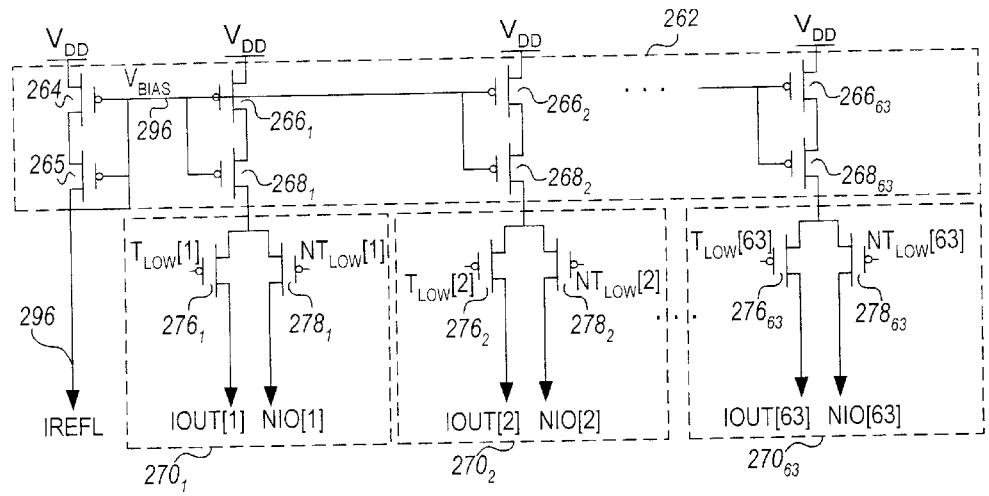
FIG. 3 is a schematic diagram of the current cell blocks of a low segmented DAC array of the prior art DAC of FIG. 2.

In design, each DAC block HDAC 220, MDAC 240, LDAC 260 requires one identical current cell 270 per each DAC setting in the given DAC block. FIG. 3 illustrates the circuit structure of the low DAC block LDAC 260 of FIG. 2. Since there are 63 possible DAC settings allowed by the LDAC 260, the LDAC requires 63 unique current cells $270_1$–$270_{63}$. Each of the 63 unique current cells $270_1$–$270_{63}$ is switchably selectable to contribute an amount of current corresponding to the amount of current output by the DAC 200 when only the LSB of the digital input signal D is asserted (i.e., D[16]). In this example, the LSB current is equal to the low reference current $I_{refL}=I_{MAX}/2e^{16}$.

Preferably, the current source uses symmetric differential signal paths to more effectively reject noise and distortion (e.g., substrate noise or channel charge injection). Accordingly, in the preferred embodiment, the switch is implemented with a differential output current switch comprising two PFETs 276, 278 in parallel, each selectable by differential signals T[i], NT[i], where i is the bit number corresponding to the current source block. A differential input signal consists of two signals wherein the information to be presented is supplied as the signal inverses (i.e.,180 degrees out of phase) or logical complements of each other.

The current cell blocks are biased by a multiple-load current-mirror bias circuit 262 which sets the amount of current flowing through each of the identical current cell blocks $270_1$–$270_{63}$. To prevent the output current from varying with slight variations in $V_{DS}$ due to changes in $V_{DS}$ produced by voltage swings across the load (i.e., the respective current source $270_1$–$270_{63}$), the output impedance of each current mirror $270_1$–$270_{63}$ needs to be as close to infinite as possible. Accordingly, in order to achieve a robust voltage bias $V_{BIAS}$, the multiple-load current-mirror bias circuit 262 regulates current mirror PMOS devices 264, $266_1$, $266_2$, $266_{63}$. The current-steering portion of the bias circuit 262 is formed with a current mirror PMOS device 264 and a pseudo-cascode device 265 which increases the output impedance.

The prior art hybrid solution for a 16-bit DAC has the advantages that by segmenting the internal DAC functionality, fewer current cells are required. In addition, because all the current cell blocks in all of the DAC segments 220, 240, 260 are identical both in structure and size, the design increases the DAC precision and linearity, improving the cell mismatch problem. Thus, in the 16-bit DAC of the example 4-6-6 segmented structure of FIG. 2, the DAC only requires a total of 141 current cells (15 cells for the HDAC, 63 cells for the MDAC, and 63 cells for the LDAC). Clearly, this is a staggering improvement over the 65,536 cells required for a pure internal thermometer code selection scheme described previously. However, the tradeoff is that the 16-bit DAC requires three separate reference currents, each weighted proportionally to the degree of segmentation. Thus, in the 16-bit 4-6-6 segmented DAC example, the reference currents have the following relationship: $I_{refH}=I_{MAX}/2e^4$; $I_{refM}=I_{MAX}/2e^{10}$; and $I_{refL}$=LSB current=$I_{MAX}/2^{16}$.

The use of three different reference currents presents design complications. The reference currents must be accurately tuned with one another in order to ensure linearity as the programmable range crosses over from a lower DAC block to a higher DAC block. When the low reference current $I_{refL}$ must be very low (e.g., approximately 15 pA), a very slight error in component sizing or process/voltage/temperature variations in the chip can have a significant impact on the accuracy of the DAC. In order for the DAC to function properly, the current variation on the output line DACIOUT between each programmed step must be less than half that of a full step size (i.e., less than half the LSB current). In the 16-bit DAC example which specifies a maximum operating current of 1 mA, the means that the error between each programmed step must be less than 7.5 pA. Now, in the LDAC where the low reference current $I_{refL}$ is approximately 15 pA, although it is difficult to generate a precise current of this magnitude, once available, the error between programmed steps in the LDAC is easier to control. However, even though the mid reference current $I_{refM}$ is 64 times that of the low reference current $I_{refL}$, the error on the mid reference current $I_{refM}$ must still be less than 7.5 pA to ensure linearity between the DAC segments. In addition, if the error of the mid reference current $I_{refM}$ is greater than 7.5 pA in this example, a single programmed step in the MDAC input may cause the output current to skip one or more valid current levels. The same argument applies to the high reference current $I_{refH}$. Accordingly, the use of multiple reference currents is undesirable.

Another problem with the segmented DAC design with multiple reference currents is that the magnitude of the low reference current $I_{refL}$ for high-performance process technologies does not allow the current cell FETs $276_1$–$276_{63}$ in the low DAC block LDAC 260 to saturate. In fact, as discussed previously, a current of 15 pA is insufficient to drive the current mirror FETs $266_1$–$266_{63}$ into saturation, which would minimize the change in drain current with changes in $V_{DS}$ of the reference and mirror devices.

One of the primary design considerations is to ensure optimum linearity of current through the DACs programmed range. A significant component of non-linearity in high-performance process technologies is mismatch of transistor characteristics. In this type of structure, a primary mismatch component is represented by $V_{GS}$-$V_t$. Assuming the devices are in saturation, then $I_D=0.5u_nC_{ox}(W/L)_2(V_{GS}-V_T)^2$. Applying a differential calculus principle and assuming negligible mismatches in $u_nC_{ox}$, then $I_D=\hat{}I_D/\hat{}(W/L)*\hat{}(W/L)+\hat{}I_D/\hat{}(V_{GS}-V_T)*\hat{}(V_{GS}-V_T)$. You can then see that: $\hat{}I_D=0.5u_nC_{ox}(V_{GS}-V_T)^{2\hat{}}(W/L)-u_nC_{ox}(W/L)*(V_{GS}-V_T)\hat{}V_T$. The normalized average value for the current mismatch becomes: $\hat{}I_D/I_D=\hat{}(W/L)/(W/L)-2*\hat{}V_T/(V_{GS}-V_T)$. Accordingly, the greater the magnitude of $V_{GS}$-$V_t$, the less impact FET performances will vary throughout the design due to variations in $V_t$. Thus, in order to minimize current mismatch, the ($V_{GS}$-$V_T$) term must be maximized which reduces the threshold mismatch effect. In the illustrative example, given the relatively small LSB current of the low DAC (i.e., 15 pA), the current mirror FETs do not achieve a significant value of $V_{GS}$-$V_t$. This causes a higher variation of mismatch between current cells, thus reducing the linearity performance of the DAC.

Figure 4:
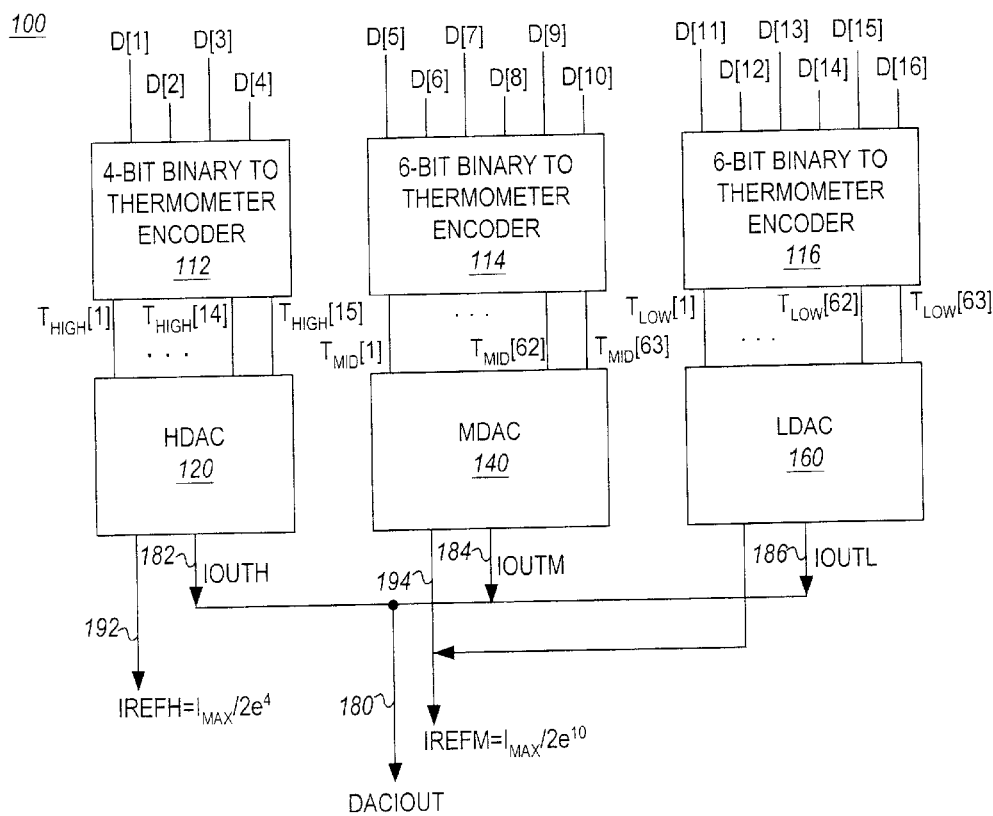
FIG. 4 is a block diagram of a 16-bit current-steered DAC implemented in accordance with the invention.

FIG. 4 shows the new DAC architecture of the invention for a 16-bit 4-6-6 segmented DAC 100. As shown, the structure is segmented similarly to that of FIG. 2, in particular segmenting the digital input signal bits D[1]–D[16] into a group of high input signal bits D[1]–D[4], a group of medium input signal bits D[5]–D[10], and a group of low input signal bits D[11]–D[16].

The high input signal bits D[1]–D[4] are provided to the input of a 4-bit binary-to-thermometer encoder 112, which encodes the binary value of the received high input signal bits D[1]–D[4] to a thermometer code represented by output thermometer code bits $T_{HIGH}[1]$–$T_{HIGH}[15]$. Only $2^4-1$ (or 15) bits are required to be output by the 4-bit binary-to-thermometer encoder 112. The high thermometer encoded select bits $T_{HIGH}[1]$–$T_{HIGH}[15]$ are provided to HDAC 120, which implements an internal thermometer code selection scheme to select zero or more current cell blocks to contribute current to a HDAC output signal IOUTH on line 182.

The mid input signal bits D[5]–D[10] are provided to the input of a 6-bit binary-to-thermometer encoder 114, which encodes the binary value of the received mid input signal bits D[5]–D[10] to a thermometer code represented by output thermometer code bits $T_{MID}[1]$–$T_{MID}[63]$. The mid thermometer encoded select bits $T_{MID}[1]$–$T_{MID}[63]$ are provided to MDAC 140, which implements an internal thermometer code selection scheme to select zero or more current cell blocks to contribute current to an MDAC output signal IOUTM on line 184.

The low input signal bits D[11]–D[15] are provided to the input of a 6-bit binary-to-thermometer encoder 116, which encodes the binary value of the received low input signal bits D[11]–D[15] to a thermometer code represented by output thermometer code bits $T_{LOW}[1]$–$T_{LOW}[63]$. The low thermometer encoded select bits $T_{LOW}[1]$–$T_{LOW}[63]$ are provided to LDAC 160, which implements an internal thermometer code selection scheme to select zero or more current cell blocks to contribute current to an LDAC output signal IOUTL on line 186.

The segmented output currents including the HDAC output signal IOUTH on line 182, MDAC output signal IOUTM on line 184, and HDAC output signal IOUTH on line 186 are summed on DAC output line 180 to produce the analog current output signal DACIOUT.

As illustrated, in the invention, the low DAC block LDAC 160 and mid DAC block MDAC 140 share the mid DAC reference current $I_{refM}$. Thus, the low reference current $I_{REFL}$ of the prior art embodiment of FIG. 2 is completely eliminated, which in itself affords the advantage of removing one external reference current.

Figure 5:
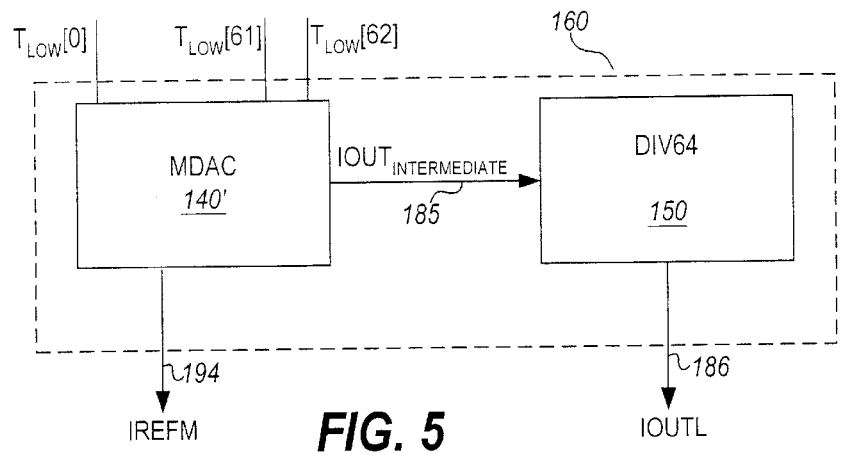
FIG. 5 is a block diagram of the internals of the low DAC array of the DAC of FIG. 4.

FIG. 5 illustrates the internal circuit structure of the Low DAC block LDAC 160 of FIG. 4. As illustrated, LDAC 160 includes a replicated copy 140' (i.e., identical copy) of the mid DAC block MDAC 140 that is controlled by the low thermometer encoded select bits $T_{LOW}[1]$–$T_{LOW}[63]$, and a current-dividing circuit 150. The replicated MDAC block 140' generates an intermediate output current $IOUT_{INTERMEDIATE}$ on line 185, which is fed to divider circuit 150. Since the mid DAC reference current $I_{refM}$ is 64 times that of $I_{refL}$ as in the prior art embodiment of FIGS. 2 and 3, the value of the intermediate output current $IOUT_{INTERMEDIATE}$ must be scaled down by 64 to represent the correct LDAC output current value. Accordingly, in the 16-bit 4-6-6 segmented DAC example, the divider circuit 150 is a divide-by-64 circuit, which proportionally scales down the output current $IOUT_{INTERMEDIATE}$ produced by the replicated MDAC 140' to produce the LDAC output signal IOUTL on line 186.

Figure 6:
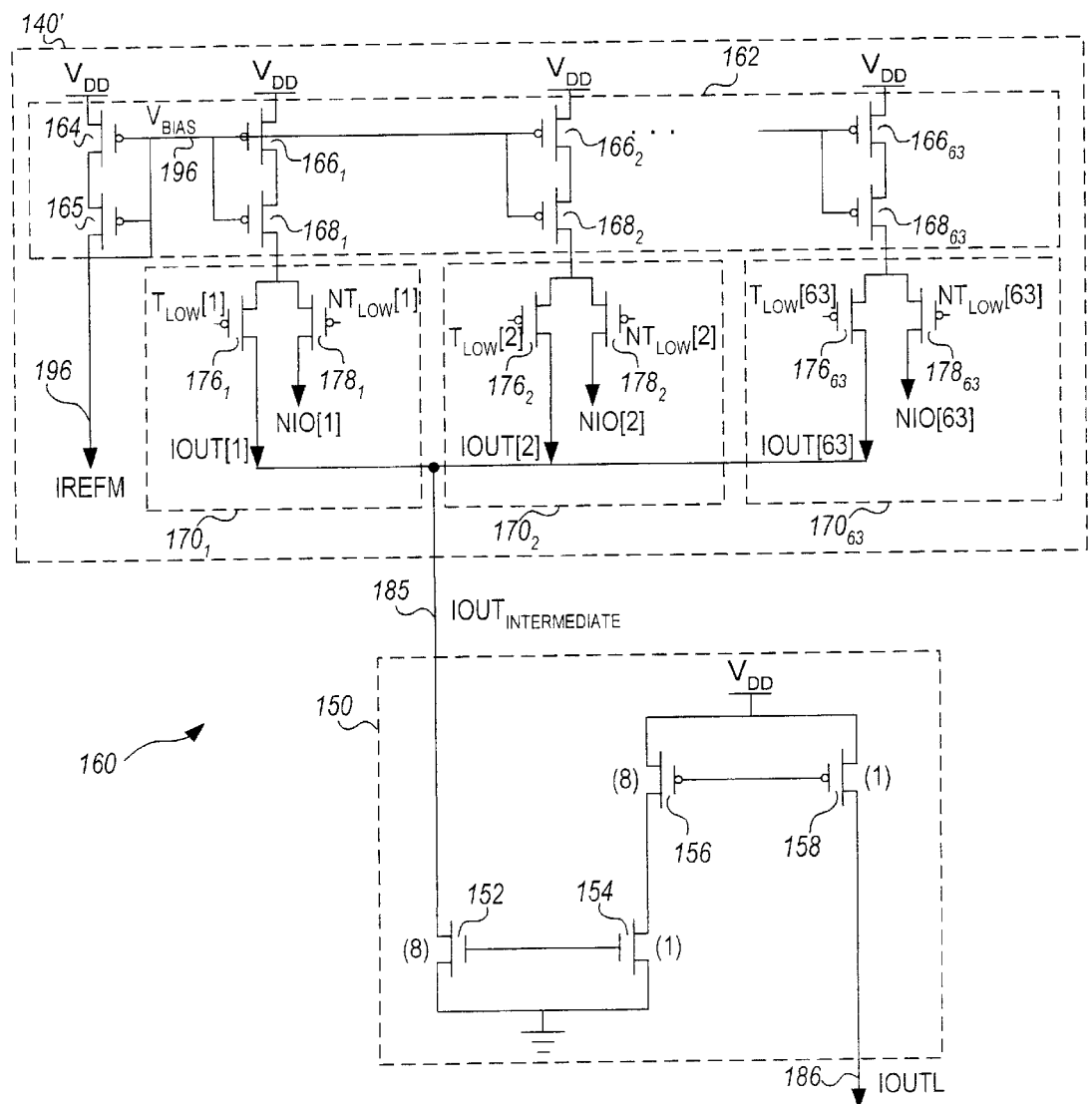
FIG. 6 is a schematic diagram of the low DAC array of the DAC of FIGS. 4 and 5 implemented according to the invention.

FIG. 6 illustrates the circuit structure of the low DAC block LDAC 160 of FIG. 5. In design, the replicated mid DAC block MDAC 140' requires one identical current cell 170 per each programmable DAC setting in the low DAC block LDAC 160. Accordingly, since there are 63 possible DAC settings for LDAC 160, the LDAC 160 requires 63 unique current cells 170₁–170₆₃. Each of the 63 unique current cells 170₁–170₆₃ is switchably selectable to contribute an amount of current equal to the LSB current of the mid DAC block (in this example, the mid reference current $I_{refM}$) to the intermediate output signal $IOUT_{INTERMEDIATE}$ on line 186.

The replicated mid DAC block MDAC 140' also includes a multiple-load current-mirror bias circuit 162 which includes a current-steering portion formed of PMOS devices 164 and 165, and multiple current-mirrors formed of PMOS devices 166₁–166₆₃ and corresponding cascode PMOS devices 168₁–168₆₃. The multiple-load, current-mirror bias circuit 162 sets the amount of current flowing through each of the identical current cell blocks 170₁–170₆₃.

The replication of the mid DAC block MDAC 140' within the low DAC block LDAC 160 optimizes performance matching between the LDAC 160 and MDAC 140. The clear advantage of the structure of the invention is that the LSB current inside the LDAC current cells 170₁–170₆₃ is no longer ¹⁄₆₄$^{th}$ the LSB of the MDAC 140. Instead, the LSB current is equal to that of the LSB in the MDAC 140. This allows the $V_{GS}$ value of the FETs 276, 278 in the LDAC current switches 170₁–170₆₃ to be significantly greater than their $V_t$ values, which greatly improves matching characteristics between LDAC current cells.

The 16-bit DAC example illustrating the preferred embodiment of the invention is presented for illustrative purposes only. The bit segmentation may be expanded or allocated per the needs of a given application. More generally, the invention covers any DAC that segments the bits into at least two groups that share a single reference current and scales down the current output by one of the current source segments by an amount equivalent to the order of magnitude that the shared reference current exceeds the theoretical reference current of the lower current source segment.

Figure 7:
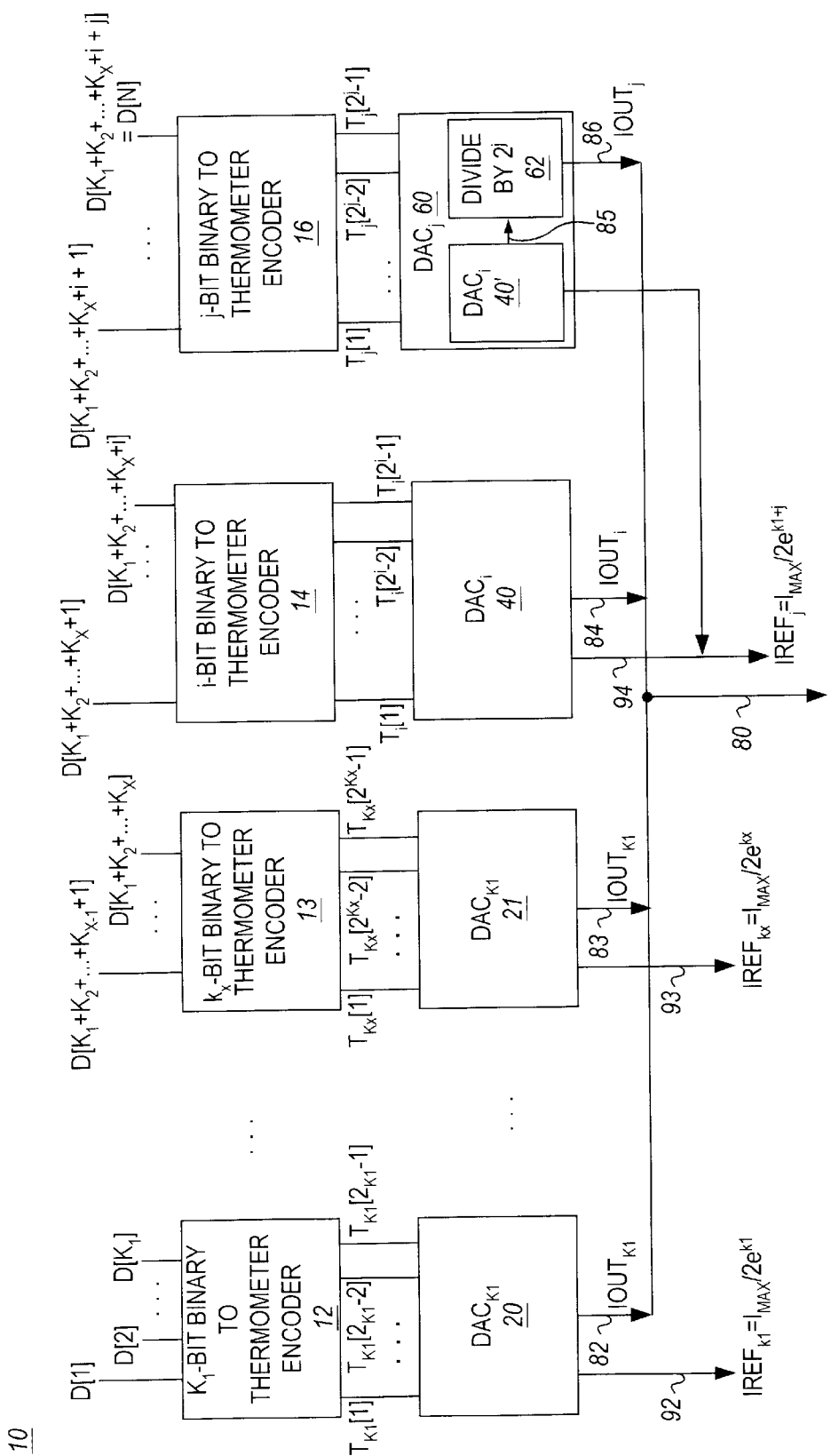
FIG. 7 is a block diagram of a generalized DAC of the invention.

FIG. 7 illustrates a more generalized DAC 10 of the invention. As illustrated, the N-bit binary digital input signal is segmented into at least a first group of i bits and a second group of j bits. The DAC 10 includes a binary-to-thermometer encoder 12, 13, 14, 16 dedicated to each segmented group i, j of digital input signal bits. A first binary-to-thermometer encoder 16 converts the first group of i bits to a thermometer code represented by $2^i$ thermometer code bits $T_i[1]$–$T_i[2^i-1]$. A second binary-to-thermometer encoder 14 converts the second group of j bits to a thermometer code represented by $2^j$ thermometer code bits $T_j[1]$–$T_j[2^j-1]$. Additional binary-to-thermometer encoders 12, 13 may be used if the digital input signal of N bits is further segmented into additional segmented groups of bits $k_x$.

The DAC 10 also includes a group of identical current-steering digital-to-analog converters (DACs) 20, 21, 40, 60 dedicated to each segmented group $k_1, \ldots, k_x$, i, j of digital input signal bits. In particular, the DAC 10 includes at least a first current-steering DAC 40, preferably implemented as an array of $2^i$ identical current sources each of which is selectable by a respective one of the $2^i$ thermometer code bits $T_i[1]$–$T_i[2^i-1]$ to contribute an identical current referenced by a first reference current $IREF_j$ to an output line 84.

The DAC 10 further includes at least a second current-steering DAC 60 comprising an array 40' of $2^j$ identical current sources each of which is selectable by a respective one of the $2^j$ thermometer code bits $T_j[1]$–$T_j[2^j-1]$ to contribute an identical current referenced by the first reference current $IREF_j$ to an intermediate output line 85. The array 40' comprises an array of current sources implemented with transistor devices that are identical in size and structure to the current sources of current-steering DAC 40. The number of current sources in the arrays 40 and 40' may vary according to i and j. The sum of the identical currents contributed by the second array 40' of $2^j$ identical current sources is summed on an intermediate output line 85. The current-steering DAC 60 also includes a scaling circuit 62 which scales down the total current present on the intermediate output line 85 by a factor of $2^j$. The divided current $IOUT_j$ is added to the current on the output line 80.

Additional arrays 20, 21 of identical current sources dedicated to each segmented group $k_x$ of digital input signal bits may be implemented if the N-bit digital input signal is further segmented into additional segmented groups of bits $k_x$. These additional segmented groups may base their current sources on a different reference current $IREF_{k1}, \ldots, IREF_{kx}$.

It will be appreciated that the current-steering DAC of the invention may be used in applications that require an analog voltage output by including an additional current-to-voltage converter to complete a digital-to-analog conversion. The current-to-voltage converter is typically implemented with a differential operational amplifier and a feedback resistor.

The DAC of the invention is advantageous in that it allows high precision, high linearity, and a high input signal bit count. The bit segmentation and shared reference current (s) allow CMOS FET saturation even in the submicron and deep submicron process technologies, thereby ensuring robust current sources necessary for high-precision, high linearity DACs.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A digital-to-analog converter for converting an N-bit binary digital input signal to an analog current signal, said N-bit binary digital input signal comprising a first group of i bits and a second group of j bits, comprising:
    a first binary-to-thermometer encoder which converts said first group of i bits to a thermometer code represented by $2^i$ thermometer code bits;
    a first array of $2^i$ identical current sources each of which is selectable by a respective one of said $2^i$ thermometer code bits to contribute an identical current referenced by a first reference current to a first current signal;
    a second binary-to-thermometer encoder which converts said second group of j bits to a thermometer code represented by $2^j$ thermometer code bits;
    a second array of $2^j$ identical current sources each of which is selectable by a respective one of said $2^j$ thermometer code bits to contribute an identical current referenced by said first reference current to an intermediate current signal; and
    a current scaling circuit which scales down said intermediate current signal by a factor of $2^j$ to generate a second current signal; and
    a summing circuit which sums at least said first current signal and said second current signal to generate said analog current signal.

2. A digital-to-analog converter in accordance with claim 1, said N-bit binary digital input signal further comprising at least one additional group x of $k_x$ bits (x=1, ..., m), comprising:
    at least one additional binary-to-thermometer encoder which converts said at least one additional group of $k_x$ bits to a thermometer code represented by $2^{Kx}$ thermometer code bits;
    at least one additional array of $2^{Kx}$ identical current sources each of which is selectable by a respective one of said $2^{Kx}$ thermometer code bits to contribute an identical current referenced by at least one additional reference current to at least one additional current signal;
    wherein said summing circuit additionally sums said at least one additional current signal to generate said analog current signal.

3. A digital-to-analog converter in accordance with claim 1, wherein said first group of $2^i$ identical current sources and said second group of $2^j$ identical current sources are identical in circuit structure and device sizing.

4. A digital-to-analog converter in accordance with claim 3, wherein each of said $2^i$ identical current sources and said $2^j$ identical current sources comprise:
    a current mirror which generates a mirrored reference current substantially identical to said first reference current; and
    a switch device which is selectable by a respective one of said $2^i$ or said $2^j$ thermometer code bits to output said mirrored reference current at a current source output.

5. A digital-to-analog converter in accordance with claim 1, comprising:

wherein each said $2^i$ identical current sources and said $2^j$ identical current sources are implemented using submicron or smaller CMOS process technology.

6. A method for converting an N-bit binary digital input signal to an analog current signal, said N-bit binary digital input signal comprising a first group of i bits and a second group of j bits, comprising:
    encoding said first group of i bits to a thermometer code represented by $2^i$ thermometer code bits;
    selecting respective ones of a first array of $2^i$ identical current sources to generate an identical current referenced by a first reference current, each of said $2^i$ identical current sources being switchably selectable by a respective one of said $2^i$ thermometer code bits to generate an output current substantially equal to said first reference current;
    summing said output current generated by each of said selected respective ones of said first group of $2^i$ identical current sources to generate a first current signal;
    encoding said second group of j bits to a thermometer code represented by $2^j$ thermometer code bits;
    selecting respective ones of a second array of $2^j$ identical current sources to contribute an identical current referenced by said first reference current to an intermediate line, each of said $2^j$ identical current sources being switchably selectable by a respective one of said $2^j$ thermometer code bits to contribute an output current substantially equal to said first reference current;
    summing said output current generated by each of said selected respective ones of said second array of $2^j$ identical current sources to generate an intermediate current signal;
    scaling down said an intermediate current signal by a factor of $2^j$ to generate a second current signal; and
    summing said first current signal and said second current signal to generate said analog current signal.

7. A method in accordance with claim 6, said N-bit binary digital input signal further comprising at least one additional group x of $k_x$ bits (x=1, ..., m), comprising:
    encoding said at least one additional group of $k_x$ bits to a thermometer code represented by $2^{Kx}$ thermometer code bits;
    selecting respective ones of at least one additional group of $2^{Kx}$ identical current sources to generate an identical current referenced by at least one additional reference current, each of said $2^{Kx}$ identical current sources being switchably selectable by a respective one of said $2^{Kx}$ thermometer code bits to generate an output current substantially equal to said respective at least one additional reference current;
    summing said output current generated by each of said selected respective ones of said at least one additional group of $2^{Kx}$ identical current sources to generate at least one additional current signal; and
    summing said at least one additional current signal with said first current signal and said second current signal to generate said analog current signal.

8. A method in accordance with claim 6, comprising:
    implementing each said $2^i$ identical current sources and said $2^j$ identical current sources using an identically structured circuit having identically sized transistors.

9. A method in accordance with claim 8, comprising:
    mirroring said first reference current to generate a mirrored reference current substantially identical to said first reference current;

providing said mirrored reference current to a switch device which is selectable by a respective one of said $2^i$ or said $2^j$ thermometer code bits to output said mirrored reference current at a current source output.

10. A method in accordance with claim 6, comprising:

implementing each said $2^i$ identical current sources and said $2^j$ identical current sources using submicron or smaller CMOS process technology.

11. A digital-to-analog converter for converting an N-bit binary digital input signal to an analog current signal, comprising:

a first current-steering digital-to-analog converter configured to receive a first group of i bits of said N-bit binary digital input signal and a first reference current to produce a first current signal representative of a value of said first group of i bits;

a second current-steering digital-to-analog converter configured to receive a second group of j bits of said N-bit binary digital input signal and said first reference current to produce an intermediate current signal representative of a value of said second group of j bits;

a current scaling circuit which scales down said intermediate current signal by an order of magnitude substantially equal to $2^j$ to produce a second current signal; and a summing circuit which sums at least said first current signal and said second current signal to produce said analog current signal.

12. A digital-to-analog converter in accordance with claim 11, comprising:

at least one additional current-steering digital-to-analog converter configured to receive a respective at least one additional group of $k_x$ bits of said N-bit binary digital input signal and a respective at least one additional reference current to produce a respective at least one additional current signal representative of a value of said respective at least one additional group of $k_x$ bits;

wherein said summing circuit additionally sums said respective at least one additional current signal to produce said analog current signal.

13. A digital-to-analog converter in accordance with claim 11, wherein:

each said first current-steering digital-to-analog converter and said second current-steering digital-to-analog converter comprise identical arrays of substantially identical current sources in circuit structure and device sizing.

14. A digital-to-analog converter in accordance with claim 11, wherein:

said identical arrays of substantially identical current sources is implemented in submicron or smaller CMOS process technology.

* * * * *